United States Patent
Zhan et al.

(10) Patent No.: US 10,375,826 B2
(45) Date of Patent: Aug. 6, 2019

(54) HIGH TEMPERATURE DRILLING ELECTRONICS

(71) Applicants: China Petroleum & Chemical Corporation, Beijing (CN); Sinopec Tech Houston, LLC., Houston, TX (US)

(72) Inventors: Sheng Zhan, Houston, TX (US); Jinhai Zhao, Houston, TX (US); Fengtao Hu, Houston, TX (US); Herong Zheng, Houston, TX (US)

(73) Assignee: CHINA PETROLEUM & CHEMICAL CORPORATION, Beijing (CN)

( * ) Notice: Subject to any disclaimer, the term of this patent is extended or adjusted under 35 U.S.C. 154(b) by 0 days.

(21) Appl. No.: 15/859,068

(22) Filed: Dec. 29, 2017

(65) Prior Publication Data

US 2019/0208625 A1 Jul. 4, 2019

(51) Int. Cl.
*H05K 1/02* (2006.01)
*H05K 1/11* (2006.01)
*H05K 1/03* (2006.01)
*H05K 1/18* (2006.01)

(52) U.S. Cl.
CPC ........ *H05K 1/0271* (2013.01); *H05K 1/0353* (2013.01); *H05K 1/111* (2013.01); *H05K 1/115* (2013.01); *H05K 1/181* (2013.01); *H05K 2201/0154* (2013.01); *H05K 2201/09509* (2013.01)

(58) Field of Classification Search
USPC ........................................................ 361/767
See application file for complete search history.

(56) References Cited

U.S. PATENT DOCUMENTS

2017/0019988 A1* 1/2017 McGrane ............ A61B 5/6801
2017/0367185 A1* 12/2017 Roessler ............. H05K 1/0298

* cited by examiner

*Primary Examiner* — Andargie M Aychillhum
(74) *Attorney, Agent, or Firm* — Novick, Kim & Lee, PLLC; Allen Xue

(57) ABSTRACT

A printed circuit board assembly (PCBA) for downhole applications has a printed circuit board (PCB) and a plurality of electronic components installed on the PCB. The PCB comprises a polyimide substrate, a lead-free surface finish, a plurality of traces, a plurality of surface mount pads, and a plurality of VIAs. The ratio between the width of one of the plurality of surface mount pads to the width of the trace connected thereto is 2 or less.

13 Claims, 2 Drawing Sheets

HIGH TEMPERATURE DRILLING ELECTRONICS

TECHNICAL FIELD

The present disclosure relates to electronic devices for high temperature drilling operations, particularly relates to the printed circuit board (PCB) and the printed circuit board assembly (PCBA) suitable for downhole environment.

BACKGROUND

Modern oil and gas explorations are carried out in complex geologic settings. The drilling operations rely heavily on real time information on the status of the drilling tools as well as the earth formation properties. The information is obtained using sensors and measurement-while-drilling (MWD) and logging-while-drilling (LWD) instruments. Although MWD refers to the measurement of the movement and location of the drilling assembly while the drilling continues and LWD focuses more on the measurement of formation properties, they are used interchangeably in this disclosure. MWD/LWD instruments are often installed in the drill collar inside the drilling assembly (i.e., bottom hole assembly or BHA).

Sensors are employed to obtain measurements in the MWD/LWD instruments and the wireline logging approach. Other electronic components include active components, such as printed circuit board assemblies (PCBA) and transistors, or passive components, such as resistors and capacitors.

PCBAs are used throughout the drilling system. For example, they can be used in the operation of the power supply, temperature sensors, pressure transducers, the battery, etc. PCBAs such as the master memory board, the read out board, the transmitter or a receiver board, and the accelerometer board are among electronic devices commonly used in a downhole environment.

PCBAs can be coupled to various sensors in a drilling system by known methods. In some embodiments, sensors may be integrated on a master memory board. Sensors can be measurement sensors that monitor real-time conditions during a drilling process. For example, some sensors monitor the properties of earth formation such as resistivity, density, porosity, permeability, acoustic properties, nuclear-magnetic resonance properties, corrosive properties of the fluids or formation, and salt or saline contents. Other sensors monitor the condition of drilling tools, such as vibrations (lateral, torsional, axial, etc.), orientations, and accelerations in the drill bit or drill strings. Still other sensors monitor the temperature and pressure of the downhole environment. In other embodiments, sensors may be prognostic sensors. Prognostic sensors are subject to more severe conditions than in a typical drilling operation (e.g., higher temperature or pressure) so that they fail at an accelerated rate. They could be used to estimate the time of failure of another component.

Sensors can be mounted on any other suitable components in a drilling assembly. For example, they can be attached to a drill bit to monitor its movement or temperature. Sensors can also be mounted along the borehole, for example, to monitor the pressure or flow rate of the drilling mud along its path. Sensors (e.g., RFID) can even be put into the fluid in the drilling system and be dispersed into the earth formation.

A processor usually is installed on a PCBA. The processor is configured to receive, store, or execute data such as computer codes or sensor signals. For example, a processor can be coupled to a program module which supplies executable instructions and a recording medium that stores various results of calculations performed by the processor. Sensor signals are the input to the processor. A PCBA may also contain telemetry unit so it can transmit sensor signals to a surface instrument for further processing. Conversely, a PCBA may also receive inputs from a surface control unit.

Downhole drilling tools, especially the drilling assembly (a.k.a. BHA), are exposed to high temperatures, pressures, as well as vibrations and shocks. Conventional drilling may occur at a temperature up to 125° C. In contrast, bottom hole temperature may exceed 200° C. in deep wells. Such high temperatures drastically reduce the reliability and useful life of downhole electronic components due to leakage current, material degradation, outgassing, corrosion, etc. As a rule of thumb, for every 25° C. increase in temperature, an electronic component would lose 90% of its useful life. Therefore, there are great needs for electronic components that have an adequate operable life, e.g., from a few days to a few weeks, for high temperature drilling operations.

SUMMARY

The present disclosure provides a printed circuit board assembly (PCBA) for downhole applications. The PCBA has a printed circuit board (PCB) and a plurality of electronic components installed on the PCB. The PCB comprises a polyimide substrate, a lead-free surface finish, a plurality of traces, a plurality of surface mount pads, and a plurality of VIAs.

In one embodiment of the current disclosure, a ratio between a width of one of the plurality of surface mount pads to a width of the trace connected thereto is 2 or less. In another embodiment, the polyimide substrate is polyimide 35N or polyimide 85N, preferably 85N.

In a further embodiment of this disclosure, the PCB has lead-free surface finish that is electroless nickel immersion gold (ENIG), electroless gold, electroless palladium, immersion silver, immersion tin (ENEPIG), organic solder-ability preservatives (OSP), or direct gold on copper (DIG), preferably electroless nickel immersion gold (ENIG).

In still another embodiment, each of the plurality of traces has a width of 0.5 mm or higher.

In other embodiments, the VIAs in the PCB include standard VIAs, microVIAs, blind VIAs, and buried VIAs. In some embodiments, the standard VIA has a hole of 0.30 mm or higher in diameter.

In still further embodiments, the PCB has one or more plated thru-holes for mounting the plurality of electronic components.

In some embodiments, the distance between an electronic component install on the PCB to an edge of the PCB that follows the following relation: when a height of the electronic component is less than 3 mm, the distance is at least 2.0 mm; and when a height of the electronic component is 3 mm or higher, the distance is at least 2.5 mm.

The printed circuit board assembly (PCBA) of this disclosure is operable up to 200° C. for more than 500 hrs.

BRIEF DESCRIPTION OF THE DRAWINGS

The teachings of the present invention can be readily understood by considering the following detailed description in conjunction with the accompanying drawing.

DETAILED DESCRIPTION

Figure 1:
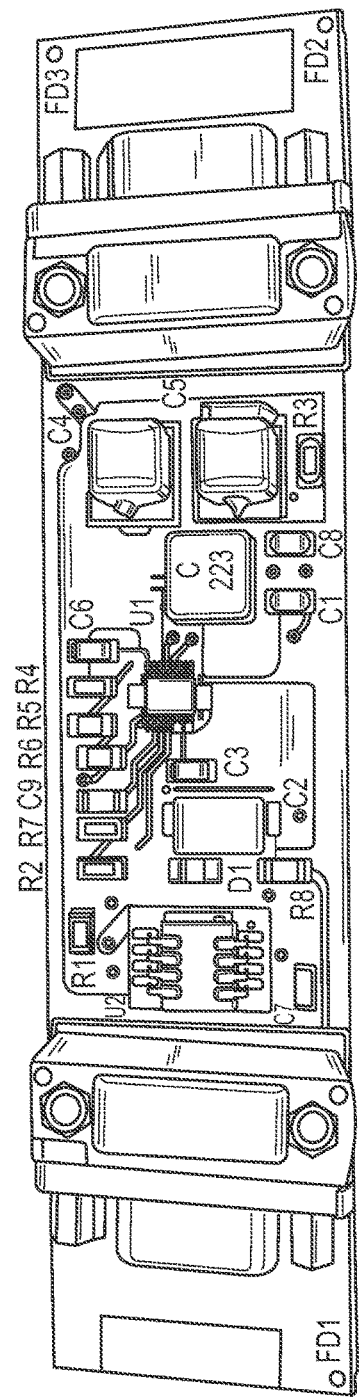
FIG. 1 is a picture of the PCBA of the current disclosure for being tested for durability.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Reference will now be made in detail to embodiments of the present disclosure, examples of which are illustrated in the accompanying drawings. It is noted that wherever practicable, similar or like reference numbers may be used in the drawings and may indicate similar or like elements.

In one embodiment of the current disclosure, the printed circuit board (PCB) comprises a polyimide substrate. Polyimdie 35N or 85N are exemplary substrates suitable for high temperature operation. Further, 85N is a preferred polyimide and laminate prepreg system for printed wiring boards that require resistance to high temperature, both in preparing the PCB (e. g., in lead-free soldering applications) and in its end-use in the bottom hole assembly downhole. It has a glass transition temperature (Tg) of greater than 250° C.

In another embodiment, the PCB shall have a lead-free surface finish. Lead in the surface finish contaminates the tin/silver high temperature solders and may reduce the melting point of the solder. The lead-free surface finish includes electroless nickel immersion gold (ENIG), electroless gold, electroless palladium, immersion silver, immersion tin (ENEPIG), organic solder-ability preservatives (OSP), and direct gold on copper (DIG).

Further, ENIG is the preferred surface finish. The fold layer in the case of ENIG is much thinner than that otherwise obtained with electrolytic plating and less likely to cause problems. The typical thickness of the ENIG layer is 3-6 µmNi/0.05-0.125 µmAu.

Other surface finishes are available. Silver and nickel have both been used for downhole PCBs, but both have solder-ability issues after a relatively brief period due to inevitable oxidation. Pure tin can also be used. Gold plating surface finish is also an option, with the knowledge that copper may dissolve in the gold and creating brittle solder joints prone to failure. To remedy this problem, a nickel plating barrier between the copper traces and the gold plating can prevent the copper from dissolving in the gold.

In a further embodiment, the PCB has a plurality of traces. The minimum width of the trace (x) and the minimum spacing between two traces (y) are shown in Table 1. If a trace is smaller than the minimum width, there is a possibility that it will open (no connection) when manufactured. If the spacing between two traces is smaller than the minimum spacing, there is chance they will short when manufactured. These parameters can be specified as the "x/y rules", where x is the minimum trace width and y is the minimum trace spacing. For example, "8/10 rules" would indicate 8 mil (i.e, 0.20 mm) minimum trace width and 10 mil (i.e., 0.25 mm) minimum trace spacing. These rules (especially spacing) apply to any metal on the PCB, including pad to track spacing and line widths for strings on the PCB.

TABLE 1

| Description | Minimum width of copper features (x) | Minimum clearance/ spacing (y) |
| --- | --- | --- |
| High density layout | 0.125 mm (5 mil) | 0.15 mm (6 mil) |
| Standard layout | 0.2 mm (8 mil) | 0.25 mm (10 mil) |
| Hand Solder board layout | 0.3 mm (12 mil) | 0.35 mm (14 mil) |

Further, traces connected to surface mount pads of the chip components shall have a ratio between the pad width to the trace width of 2 or less. Table 2 shows some exemplary trace widths.

TABLE 2

| Type of layout | Width (for current < or = 0.3A) | Width (for current > 0.3A) external layers | Width (for current > 0.3A) internal layers |
| --- | --- | --- | --- |
| High density | 0.125 mm (5 mil) | IPC-2152 | IPC-2152 |
| Standard | 0.2 mm (8 mil) | IPC-2152 | IPC-2152 |
| Hand solder | 0.3 mm (12 mil) | IPC-2152 | IPC-2152 |

In addition, a trace width of 0.5 mm or higher is preferable. With down-hole PCBs, a large trace width provides better robustness and serviceability. If smaller traces is used, fillets (a.k.a. "teardrops") or equivalent structures at pads are used to reduce stress. If smaller traces are needed to pass between pads of devices like integrated circuits, the trace width is reduced in just that area. It is good practice to replicate traces on both the component side and the solder side of the board whenever routing constraints allow same. This redundancy could be enough to prevent tool failure in certain circumstances.

In still another embodiment, the PCB has a plurality of VIAs (Vertical Interconnect Access). The VIA may be a standard VIA extending from one external layer to another external layer. Standard VIA connections to planes and polygons shall be done by means of thermal relief. VIA holes in a PCB used for downhole operation preferable is 0.30 mm or large in size. Table 3 lists specifications of standard VIA.

TABLE 3

| Item | Layer | Standard VIA (high density layout) | Standard VIA (Standard layout) |
| --- | --- | --- | --- |
| Via hole | Na | 0.3 mm (12 mil) | 0.325 mm (13 mil) |
| Via pad | All layer | 0.65 mm (26 mil) | 0.75 mm (30 mil) |
| Aspect Ratio (Depth: hole diameter) | Na | Max. 8:1 | Max 8:1 |

TABLE 3-continued

| Item | Layer | Standard VIA (high density layout) | Standard VIA (Standard layout) |
|---|---|---|---|
| Minimum number of thermal spokes | Copper Layer | 2 mm (79 mil) | 2 mm (79 mil) |
| | CIC layer | 2 mm (79 mil) | 2 mm (79 mil) |
| Minimum thermal spoke width | Copper layer less or equal 2 oz | 0.15 mm (6 mil) | 0.2 mm (8 mil) |
| | CIC layer: Copper layer > 2 oz | 0.35 mm (14 mil) | 0.35 mm (14 mil) |
| Maximum current capacity | Na | 1.5A | 2.2A |

Note that the weight of the copper layer in ounce (oz) indicates the thickness of the copper foil. The measurement refers to a foil that is required to achieve a mass of 1 oz per square foot of foil. 1 oz copper indicates 35 μm in thickness and 2 oz is equivalent to 70 μm in thickness.

In some embodiments, the PCB uses Copper-Invar-Copper (CIC) to strengthen the PCB and control expansion. Copper-Invar-Copper is a sandwich of Invar between two layers of copper. Invar is a nickel-containing iron alloy and is bonded in a rolling process that reduces the thickness to as low as 0.006". CIC is effective in constraining the overall movement of PCB in a high temperature environment. Finally, there is an additional benefit as the two layers of CIC act as inherent ground planes.

In still other embodiments, the PCB contains blind VIAs, which extend from an external layer to an internal layer. The maximum depth the blind VIA should be half of the total depth of the layers in the PCB, except for blind VIAs used for stitching or shielding. Table 4 below shows specifications of blind VIAs.

TABLE 4

| Item | Layer | Blind Via |
|---|---|---|
| Via hole | Na | 0.3 mm (12 mil) |
| Via Pad | All layer | 0.65 mm (26 mil) |
| Aspect Ratio (Depth: hole diameter) | Na | Max. 4:1 |
| Minimum number of thermal spokes | Copper layers | 2 |
| | CIC layer | 2 |
| Minimum thermal spoke width | Copper layer less or equal 2oz | 0.15 mm (6 mil) |
| | CIC layer: Copper layer > 2oz | 0.35 mm(14 mil) |
| Maximum current capacity | | 1.5A |

The PCB may also contains one or more microVIA, which is a high density interconnect (HDI) structure normally created by laser ablation. The depth of a mircoVIA shall be limited to a single layer and specifically, only for connecting an external layer to first internal layer. The microVIA can also be a VIA-in-pad, which further has copper plugged mircoVIA. Micro connection to planes and polygons is a direct connection without thermal relief.

TABLE 5

| Item | Layer | μVia |
|---|---|---|
| Via hole | Na | 0.13 mm (5 mil) |
| Via Pad | All layer | 0.35 mm (14 mil) |
| Aspect Ratio (Depth: hole diameter) | Na | Max 1:1 |
| Maximum current capacity | Na | about 0.5A |

The VIA in the PCB may also be a buried VIA, which extends from an internal layer another internal layer.

In still other embodiments, the PCB contains one or more thermal VIA for thru-PCB heat transfer. Thermal VIAs may be used when the pad is electrically non-essential; or the total maximum internal volume of thermal VIA in a pad is less than 5% of the pad's area multiplied by 0.15; or the thermal VIAs that are not inside unmasked copper areas are tented with solder mask.

In still other embodiments, all standard VIAs and free pads with holes smaller than 0.8 mm on the PCB are capped using secondary solder mask application process. VIA capping is done to prevent seepage of potting and staking liquids from one side of the board to another. VIAs shall be capped from one side of the board only. Normally the masking is applied on the main mounting layer, however, on PCBs that have surface mount grid array components (like BGAs) the masking shall be applied on the side that is opposite from the mounting side of those components.

In further embodiments, the PCB also contains one or more PTHs (Plated Thru-Hole) for mounting electronic components. The electronic component may have multiple pins. Table 6 below shows preferred pin size to PTH size relationship.

TABLE 6

| Item | Value (Round Pin) | Value (Rectangular Pin) |
|---|---|---|
| Pin size | Dmax is Maximum Pin Diameter | Dmax is Maximum Pin Diagonal |
| Hole size | Dmax + 0.2 mm (8 mil) or Dmax + 0.45 mm (18 mil) | Dmax + 0.1 mm (4 mil) or Dmax + 0.35 mm (14 mil) |

Table 7 below shows preferred PTH pad size in some embodiments of this disclosure.

TABLE 7

| Item | Layer | Minimum Value |
|---|---|---|
| PTH pad | All layers | [Hole Diameter] + 0.6 mm (24 mil) |
| PTH pad distance | All layers | Body size + 4 mm [160 mil] |

Fillets (or teardrops) are preferably employed for solder connections between the PTH and traces on the PCB. All trace connections to PTHs on boards that utilize Copper/Invar/Copper (CIC) constraining cores shall be made on the external layers only, either top or bottom.

Further, all soldered PTH connections to planes and polygons shall be done by means of thermal reliefs, which may be calculated per Section 9.1.2 of IPC-2222.

According to IPC-2222 (Section 9.1.2), total width of all thermal spokes on all layers combined shall not exceed 4 mm. This rule is calculated for 1 oz copper layers. Any layer that is not 1 oz is converted to 1 oz equivalents prior to finding the total width of all thermal spokes on all layers. CIC layers shall be converted as 1.5 times 1 oz copper layer.

TABLE 8

| Item | Layer | High density layout | Standard layout |
|---|---|---|---|
| Minimum number of thermal spokes | Copper layers | 2 | 2 |
| | CIC layers | 2 | 2 |
| Minimum Thermal spoke width | Copper layers less or equal 2 oz | 0.15 mm (6 mil) | 0.2 mm (8 mil) |
| | CIC layers; | 0.35 mm (14 mil) | 0.35 mm (14 mil) |
| | Copper layers > 2 oz | | |

For example, a standard layout PCB with two CIC planes and two 2 oz copper planes, a PTH is connected with two 0.35 mm spokes on each CIC layer and two 0.2 mm spokes on each copper layer:

0.7 mm (CIC1)+0.7 mm (C1C2)+0.4 mm (Copper1)+0.4 mm (Copper2)

becomes 0.7 mm×1.5+0.7 mm×1.5+0.4 mm×2+0.4 mm×2=3.7 mm

In the same example above, when there are two additional 1 oz copper layers connected with two 0.2 mm spokes each, then the total width of all thermal spokes on all layers combined exceeds the permitted maximum of 4 mm and require design changes.

Alternative, in other embodiments, a short trace is routed out of the PTH and connected to all the planes through a standard VIA.

In still other embodiments, PTH component lead center spacing follows the method for calculating the centerline mounting distance of electronic components:

CS=Center spacing of mounting pads.
L=Length of Component Body (Maximum).
DCL=Diameter of Component lead (Maximum)
BAF=Bend Allowance Factor
BAF equation=(7.6×DCL)−0.3

Accordingly, in exemplary embodiments,
BAF=3.8 mm (0.150") when DCL is less than or equal to 0.54 mm (0.022")
BAF=4.5 mm (0.180") when DCL is less than or equal to 0.64 mm (0.025")
BAF=5.6 mm (0.200") when DCL is less than or equal to 0.71 mm (0.028")
BAF=5.8 mm (0.230") when DCL is less than or equal to 0.81 mm (0.032")

In further embodiments in the PCB of this disclosure, design planes and split-planes are set using Altium Plane Layers. Alternatively, when a VIA or a PTH requires layer dependent plane connections (e.g. connection to CIC is different than connection to Copper), Polygons are used on those layers is permitted.

Preferably, polygons shall be poured in solid fill mode. Copper necks having widths less than the minimum thermal spoke width shall be removed.

In embodiments where planes and polygons are of Copper/Invar/Copper (CIC) cores, the following features are present. The CIC plane outline covers the complete surface of a layer minus the CIC to board edge clearance. Splitting CIC planes for multiple nets or islands that are detached from the rest of the CIC foil shall not be present. In addition, on CIC planes, the length (B) of a "one-end-connected" spike is no more than half of its attachment width (A).

In still other embodiments, the PCB has specific dimensions. Tables 8 and 9 show some exemplary dimensions of the length and the width of the PCB, respectively.

TABLE 9

| Item | Layer | Value | Tolerance |
| --- | --- | --- | --- |
| Maximum length | Mechanical | <381 mm (15") | −0.2 mm (8 mil) |
| Width | Mechanical | 20.3 mm (0.8")<br>22.9 mm (0.9")<br>24.0 mm (0.94")<br>25.4 mm (1")<br>28.0 mm (1.1")<br>31.7 mm (1.25")<br>38.1 mm (1.5")<br>45 mm (1.77")<br>60 mm (2.36") | −0.2 mm (8 mil) |

The PCB has a thickness of 1.6 mm, 2.10 mm, or 2.36 mm. A thickness tolerance of ±0.15 mm is acceptable.

In further embodiments, dielectric layers type and thickness are symmetrical about the long centerline of a board cross-section. Metal layers type and thickness are symmetrical about the long centerline of a board cross-section. Number of layers is an even number.

The PCB may consist of sequential laminations, which form symmetrical pairs of subs to avoid bow. Further, when blind VIAs or buried VIAs are used, they are present on both sides of the PCB and have identical depth.

The PCB in the current disclosure has electronic components disposed on the PCB. Table 10 shows exemplary minimum distances between the electronic components and the edge of the PCB.

TABLE 10

| Component height | Minimum distance from PCB outline |
| --- | --- |
| <3 mm (118 mil) | Sp = 2.0 mm (0.08") |
| 3 mm or higher | Sp = 2.5 mm (0.1") |

In certain embodiments, the PCB is mounted with rubber grommets. In such a PCB the weight of parts on the PCB and the width of the PCB are evenly distributed across the PCB. At least four Rubber Grommets are used and place in pairs, e.g., one at each long side of the PCB. The distance between two adjacent rubber grommets shall be 50 mm or less, e.g., 25.4 mm.

Further, SMT components shall not be placed underneath Thru-hole or larger SMT components on the same side of the board. Thru-hole components shall not be placed on the bottom side of the PCB unless it is an unavoidable functional design requirement.

Lab Tests

A PCBA of the disclosure was tested at 200° C. for high temperature survivability.

Figure 2:
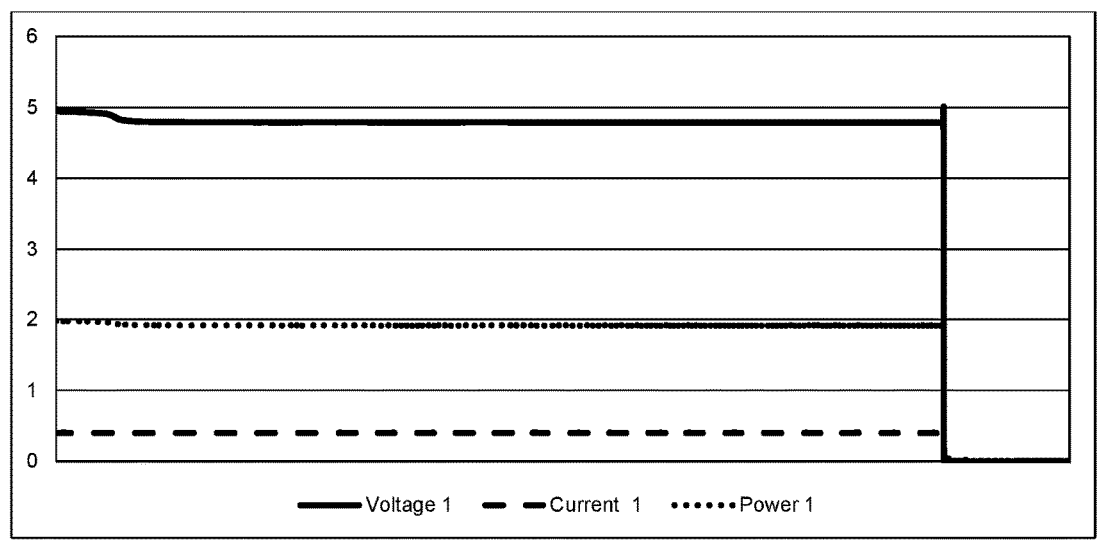
FIG. 2 is a plot showing data at the end of the durability test of the PCBA at 175° C.

FIG. 1 is a picture of the tested PCBA. The PCB has a surface finish of ENIG and a copper thickness is 2 oz. The solder was SN96. The inner layer copper was pulled back by 0.025 inches from the edge. It is connected with a load box set for 5 VDC at 400 mA. LabVIEW was used to control and log data from the power supply. The PCBA was tested continuously for 797 hours at 200° C. in an oven before it failed to meet the requirements set on the load box. FIG. 2 shows data from the last week of testing, indicating a sudden drop of voltage after being in the oven at 200° C. after a cumulative 797 hours.

In addition, a directional drilling module equipped with PCBs of the current disclosure and a plurality of sensors (azimuth, inclination, total H field, total G field, dip angle, etc.) successfully passed a series of tests designed to test the performance in downhole conditions.

In the vibration test, the random vibrations of 20 $G_{rms}$ were applied to the directional drilling module at 175° C. Table 11 compare the shift in sensor signals before and after the tests. Minor shifts were observed but the results were within the specification.

TABLE 11

| 175° C. | | Inc | Before Temp&Vib | After Temp&Vib | Shift |
|---|---|---|---|---|---|
| Azimuth spread [deg] | North | 90 | 0.132 | 0.285 | 0.152 |
| | | 45 | 0.167 | 0.358 | 0.191 |
| | | 10 | 0.072 | 0.293 | 0.221 |
| | | 5 | 0.401 | 0.591 | 0.19 |
| | West | 90 | 0.172 | 0.236 | 0.064 |
| | | 45 | 0.126 | 0.228 | 0.103 |
| | | 10 | 0.31 | 0.352 | 0.042 |
| | | 5 | 0.709 | 0.531 | −0.179 |
| Inclination spread [deg] | North | 90 | 0.038 | 0.078 | 0.04 |
| | | 45 | 0.023 | 0.047 | 0.024 |
| | | 10 | 0.017 | 0.044 | 0.027 |
| | | 5 | 0.023 | 0.043 | 0.02 |
| | West | 90 | 0.04 | 0.085 | 0.045 |
| | | 45 | 0.036 | 0.054 | 0.018 |
| | | 10 | 0.034 | 0.046 | 0.013 |
| | | 5 | 0.036 | 0.047 | 0.011 |
| Total H field spread [nT] | North | 90 | 50.4 | 88.8 | 38.4 |
| | | 45 | 6.8 | 16.5 | 9.7 |
| | | 10 | 23.8 | 79.6 | 55.8 |
| | | 5 | 15.9 | 82.7 | 66.8 |
| | West | 90 | 39.2 | 129.7 | 90.5 |
| | | 45 | 38.3 | 107.4 | 69.1 |
| | | 10 | 21.7 | 89.9 | 68.2 |
| | | 5 | 25.6 | 88.2 | 62.6 |
| | Total | | 50.4 | 152.5 | 102.1 |
| Total g field spread [mG] | North | 90 | 0.28 | 1.5 | 1.22 |
| | | 45 | 0.4 | 1.17 | 0.77 |
| | | 10 | 0.26 | 0.28 | 0.01 |
| | | 5 | 0.18 | 0.19 | 0.01 |
| | West | 90 | 0.64 | 1.39 | 0.75 |
| | | 45 | 0.48 | 1.24 | 0.76 |
| | | 10 | 0.13 | 0.3 | 0.18 |
| | | 5 | 0.07 | 0.1 | 0.03 |
| | Total | | 1.36 | 1.92 | 0.56 |
| Dip Angle spread [deg] | North | 90 | 0.083 | 0.257 | 0.173 |
| | | 45 | 0.078 | 0.278 | 0.199 |
| | | 10 | 0.067 | 0.244 | 0.177 |
| | | 5 | 0.061 | 0.238 | 0.177 |
| | West | 90 | 0.073 | 0.143 | 0.069 |
| | | 45 | 0.113 | 0.241 | 0.128 |
| | | 10 | 0.147 | 0.247 | 0.1 |
| | | 5 | 0.12 | 0.246 | 0.127 |
| | Total | | 0.179 | 0.349 | 0.17 |

In the shock tests, the magnitude of the shocks was 500 G. Each shock was applied as half-sine wave at a duration of 1 ms each in six different directions (i.e., +X, −X, +Y, −Y, +Z, −Z) for 10 shocks in each direction. The PCBA was powered during the shock tests. The shock tests were carried out at room temperature, 150° C., and 175° C., respectively. Table 12 shows the results from various sensors before and after the shock tests at 175° C.

TABLE 12

| 175 °C. | | Inc | Before Shock | After Shock | Shift |
|---|---|---|---|---|---|
| Azimuth spread [deg] | North | 90 | 0.1 | 0.122 | 0.022 |
| | | 45 | 0.075 | 0.171 | 0.096 |
| | | 10 | 0.46 | 0.68 | 0.22 |
| | | 5 | 0.998 | 1.102 | 0.104 |
| | West | 90 | 0.065 | 0.035 | −0.03 |
| | | 45 | 0.132 | 0.103 | −0.029 |
| | | 10 | 0.509 | 0.568 | 0.059 |
| | | 5 | 1.047 | 1.158 | 0.111 |
| Inclination spread [deg] | North | 90 | 0.017 | 0.027 | 0.01 |
| | | 45 | 0.062 | 0.074 | 0.011 |
| | | 10 | 0.088 | 0.106 | 0.018 |
| | | 5 | 0.093 | 0.096 | 0.003 |
| | West | 90 | 0.014 | 0.033 | 0.018 |
| | | 45 | 0.078 | 0.068 | −0.01 |
| | | 10 | 0.098 | 0.103 | 0.005 |
| | | 5 | 0.099 | 0.101 | 0.002 |
| Total H field spread [nT] | North | 90 | 36.9 | 94.5 | 57.6 |
| | | 45 | 10.1 | 63.1 | 53 |
| | | 10 | 13.6 | 57.4 | 43.8 |
| | | 5 | 17.9 | 59.4 | 41.5 |
| | West | 90 | 48.6 | 118.7 | 70.1 |
| | | 45 | 36.1 | 92.6 | 56.5 |
| | | 10 | 25.5 | 57.3 | 31.8 |
| | | 5 | 26 | 67.9 | 41.9 |
| | Total | | 48.6 | 140.1 | 91.5 |
| Total g field spread [mG] | North | 90 | 1.51 | 1.75 | 0.24 |
| | | 45 | 1.09 | 1.21 | 0.12 |
| | | 10 | 0.29 | 0.35 | 0.06 |
| | | 5 | 0.3 | 0.18 | −0.12 |
| | West | 90 | 1.77 | 1.78 | 0.01 |
| | | 45 | 1.26 | 1.22 | −0.04 |
| | | 10 | 0.23 | 0.33 | 0.1 |
| | | 5 | 0.12 | 0.16 | 0.04 |
| | Total | | 1.89 | 1.92 | 0.03 |
| Dip Angle spread [deg] | North | 90 | 0.051 | 0.128 | 0.077 |
| | | 45 | 0.035 | 0.107 | 0.072 |
| | | 10 | 0.045 | 0.028 | −0.017 |
| | | 5 | 0.045 | 0.035 | −0.01 |
| | West | 90 | 0.069 | 0.089 | 0.02 |
| | | 45 | 0.066 | 0.069 | 0.003 |
| | | 10 | 0.055 | 0.05 | −0.006 |
| | | 5 | 0.052 | 0.04 | −0.012 |
| | Total | | 0.086 | 0.172 | 0.086 |

Extended roll tests at different temperatures were also carried out. Table 13 shows data from roll tests of the directional module at 175° C. for a cumulative 1000 hours.

TABLE 13

| | | | Roll Test Data | | | | Shift from 0 h data | | |
|---|---|---|---|---|---|---|---|---|---|
| 175° C. | | Inc | 0 h | 200 h | 493 h | 1000 h | 200 h | 493 h | 1000 h |
| Azimuth spread [deg] | North | 90 | 0.137 | 0.203 | 0.196 | 0.223 | 0.066 | 0.06 | 0.087 |
| | | 45 | 0.045 | 0.081 | 0.106 | 0.093 | 0.036 | 0.061 | 0.048 |
| | | 10 | 0.501 | 0.793 | 0.877 | 0.737 | 0.292 | 0.376 | 0.236 |
| | | 5 | 1.178 | 1.886 | 1.783 | 1.866 | 0.707 | 0.604 | 0.688 |
| | West | 90 | 0.066 | 0.059 | 0.048 | 0.078 | −0.007 | −0.018 | 0.012 |
| | | 45 | 0.059 | 0.194 | 0.258 | 0.246 | 0.136 | 0.199 | 0.187 |
| | | 10 | 0.571 | 0.891 | 0.969 | 0.955 | 0.32 | 0.398 | 0.384 |
| | | 5 | 1.134 | 1.828 | 1.647 | 1.581 | 0.695 | 0.514 | 0.447 |
| Inclination spread [deg] | North | 90 | 0.027 | 0.015 | 0.021 | 0.022 | −0.012 | −0.006 | −0.005 |
| | | 45 | 0.07 | 0.113 | 0.116 | 0.103 | 0.042 | 0.046 | 0.032 |
| | | 10 | 0.097 | 0.152 | 0.16 | 0.148 | 0.055 | 0.063 | 0.051 |
| | | 5 | 0.103 | 0.158 | 0.162 | 0.131 | 0.055 | 0.059 | 0.028 |

TABLE 13-continued

|  |  |  | Roll Test Data | | | | Shift from 0 h data | | |
|---|---|---|---|---|---|---|---|---|---|
| 175° C. | | Inc | 0 h | 200 h | 493 h | 1000 h | 200 h | 493 h | 1000 h |
|  | West | 90 | 0.015 | 0.012 | 0.023 | 0.029 | −0.003 | 0.008 | 0.014 |
|  |  | 45 | 0.082 | 0.119 | 0.113 | 0.105 | 0.037 | 0.031 | 0.023 |
|  |  | 10 | 0.109 | 0.157 | 0.162 | 0.141 | 0.047 | 0.053 | 0.032 |
|  |  | 5 | 0.117 | 0.163 | 0.164 | 0.13 | 0.046 | 0.047 | 0.013 |
| Total | North | 90 | 22.3 | 53.5 | 45.8 | 41.8 | 31.2 | 23.5 | 19.5 |
| H field |  | 45 | 4.3 | 45.5 | 68 | 17.9 | 41.2 | 63.7 | 13.6 |
| [nT] |  | 10 | 13.9 | 21.5 | 43 | 30.4 | 7.6 | 29.1 | 16.5 |
|  |  | 5 | 16.2 | 29 | 32.5 | 37.5 | 12.8 | 16.3 | 21.3 |
|  | West | 90 | 25.9 | 74.5 | 48.2 | 56.2 | 48.6 | 22.3 | 30.3 |
|  |  | 45 | 17.7 | 48.2 | 65.7 | 62.6 | 30.5 | 48 | 44.9 |
|  |  | 10 | 8.2 | 58.7 | 40.3 | 64.2 | 50.5 | 32.1 | 56 |
|  |  | 5 | 10.9 | 21.1 | 55.6 | 58.2 | 10.2 | 44.7 | 47.3 |
|  | Total |  | 45.1 | 82.7 | 104.2 | 99.2 | 37.6 | 59.1 | 54.1 |
| Total | North | 90 | 1.44 | 2.24 | 2.05 | 2.46 | 0.81 | 0.62 | 1.02 |
| g field |  | 45 | 1.32 | 1.99 | 1.87 | 1.76 | 0.67 | 0.56 | 0.44 |
| spread |  | 10 | 0.19 | 0.31 | 0.4 | 0.39 | 0.12 | 0.21 | 0.2 |
| [mG] |  | 5 | 0.08 | 0.16 | 0.16 | 0.17 | 0.08 | 0.07 | 0.09 |
|  | West | 90 | 1.37 | 2.21 | 2.3 | 2.36 | 0.84 | 0.93 | 0.98 |
|  |  | 45 | 1.38 | 1.98 | 1.94 | 1.75 | 0.6 | 0.56 | 0.37 |
|  |  | 10 | 0.21 | 0.67 | 0.43 | 0.44 | 0.46 | 0.22 | 0.23 |
|  |  | 5 | 0.13 | 0.29 | 0.2 | 0.19 | 0.16 | 0.07 | 0.06 |
|  | Total |  | 1.87 | 2.44 | 2.49 | 2.48 | 0.57 | 0.62 | 0.6 |
| Dip | North | 90 | 0.038 | 0.047 | 0.032 | 0.047 | 0.008 | −0.006 | 0.009 |
| Angle |  | 45 | 0.075 | 0.132 | 0.176 | 0.132 | 0.057 | 0.101 | 0.058 |
| spread |  | 10 | 0.133 | 0.2 | 0.193 | 0.17 | 0.067 | 0.061 | 0.037 |
| [deg] |  | 5 | 0.143 | 0.206 | 0.162 | 0.182 | 0.063 | 0.018 | 0.039 |
|  | West | 90 | 0.205 | 0.224 | 0.207 | 0.191 | 0.019 | 0.002 | −0.014 |
|  |  | 45 | 0.121 | 0.184 | 0.188 | 0.206 | 0.063 | 0.067 | 0.085 |
|  |  | 10 | 0.091 | 0.154 | 0.173 | 0.193 | 0.062 | 0.082 | 0.101 |
|  |  | 5 | 0.118 | 0.19 | 0.17 | 0.187 | 0.073 | 0.052 | 0.069 |
|  | Total |  | 0.205 | 0.24 | 0.227 | 0.233 | 0.035 | 0.022 | 0.028 |

In the temperature cycle tests, fifty temperature cycles of the directional module were carried out from room temperature to 175° C. The results are shown in Table 14.

TABLE 14

|  |  |  | Roll Test Data | | | Shift from 0 cycle data | |
|---|---|---|---|---|---|---|---|
| 175° C. |  | Inc | 0 cycle | 50 cycle | 100 cycle | 50 cycle | 100 cycle |
| Azimuth | North | 90 | 0.173 | 0.144 | 0.174 | −0.029 | 0.001 |
| spread |  | 45 | 0.124 | 0.105 | 0.071 | −0.019 | −0.052 |
| [deg] |  | 10 | 0.106 | 0.247 | 0.515 | 0.141 | 0.409 |
|  |  | 5 | 0.416 | 0.743 | 1.263 | 0.327 | 0.847 |
|  | West | 90 | 0.05 | 0.089 | 0.093 | 0.039 | 0.043 |
|  |  | 45 | 0.064 | 0.133 | 0.13 | 0.069 | 0.066 |
|  |  | 10 | 0.212 | 0.438 | 0.639 | 0.226 | 0.427 |
|  |  | 5 | 0.436 | 0.797 | 1.606 | 0.361 | 1.171 |
| Inclin- | North | 90 | 0.012 | 0.03 | 0.023 | 0.018 | 0.012 |
| ation |  | 45 | 0.025 | 0.074 | 0.095 | 0.049 | 0.07 |
| spread |  | 10 | 0.026 | 0.061 | 0.104 | 0.034 | 0.078 |
| [deg] |  | 5 | 0.03 | 0.076 | 0.105 | 0.045 | 0.074 |
|  | West | 90 | 0.019 | 0.022 | 0.032 | 0.003 | 0.013 |
|  |  | 45 | 0.03 | 0.08 | 0.081 | 0.05 | 0.051 |
|  |  | 10 | 0.033 | 0.074 | 0.116 | 0.04 | 0.083 |
|  |  | 5 | 0.029 | 0.07 | 0.109 | 0.041 | 0.08 |
| Total | North | 90 | 23 | 38.9 | 33.3 | 15.9 | 10.3 |
| H field |  | 45 | 34.5 | 27.6 | 21.5 | −6.9 | −13 |
| spread |  | 10 | 18.8 | 39.6 | 33.4 | 20.8 | 14.6 |
| [nT] |  | 5 | 8.6 | 45.8 | 54.2 | 37.2 | 45.6 |
|  | West | 90 | 10.5 | 62.2 | 31.1 | 51.7 | 20.6 |
|  |  | 45 | 10.5 | 27.6 | 65.7 | 17.1 | 55.2 |
|  |  | 10 | 18.6 | 40.6 | 42.4 | 22 | 23.8 |
|  |  | 5 | 5.1 | 25.2 | 51.2 | 20.1 | 46.1 |
|  | Total |  | 65 | 65.4 | 72 | 0.4 | 7 |
| Total | North | 90 | 0.61 | 1.11 | 1.67 | 0.5 | 1.06 |
| g field |  | 45 | 0.44 | 0.66 | 1.14 | 0.22 | 0.7 |
| spread |  | 10 | 0.17 | 0.14 | 0.3 | −0.03 | 0.13 |
| [mg] |  | 5 | 0.14 | 0.05 | 0.1 | −0.08 | −0.04 |
|  | West | 90 | 0.57 | 1.13 | 1.68 | 0.56 | 1.11 |
|  |  | 45 | 0.43 | 0.74 | 1.05 | 0.31 | 0.62 |
|  |  | 10 | 0.12 | 0.22 | 0.24 | 0.09 | 0.12 |
|  |  | 5 | 0.14 | 0.06 | 0.11 | −0.08 | −0.03 |
|  | Total |  | 0.98 | 1.25 | 1.85 | 0.26 | 0.87 |
| Dip | North | 90 | 0.033 | 0.082 | 0.076 | 0.049 | 0.044 |
| Angle |  | 45 | 0.06 | 0.135 | 0.117 | 0.074 | 0.057 |
| spread |  | 10 | 0.045 | 0.105 | 0.143 | 0.06 | 0.097 |
| [deg] |  | 5 | 0.045 | 0.113 | 0.137 | 0.068 | 0.091 |
|  | West | 90 | 0.066 | 0.079 | 0.114 | 0.012 | 0.047 |
|  |  | 45 | 0.036 | 0.116 | 0.175 | 0.08 | 0.139 |
|  |  | 10 | 0.08 | 0.111 | 0.126 | 0.031 | 0.045 |
|  |  | 5 | 0.067 | 0.136 | 0.13 | 0.069 | 0.062 |
|  | Total |  | 0.111 | 0.148 | 0.197 | 0.037 | 0.086 |

Field Tests

Figure 3:
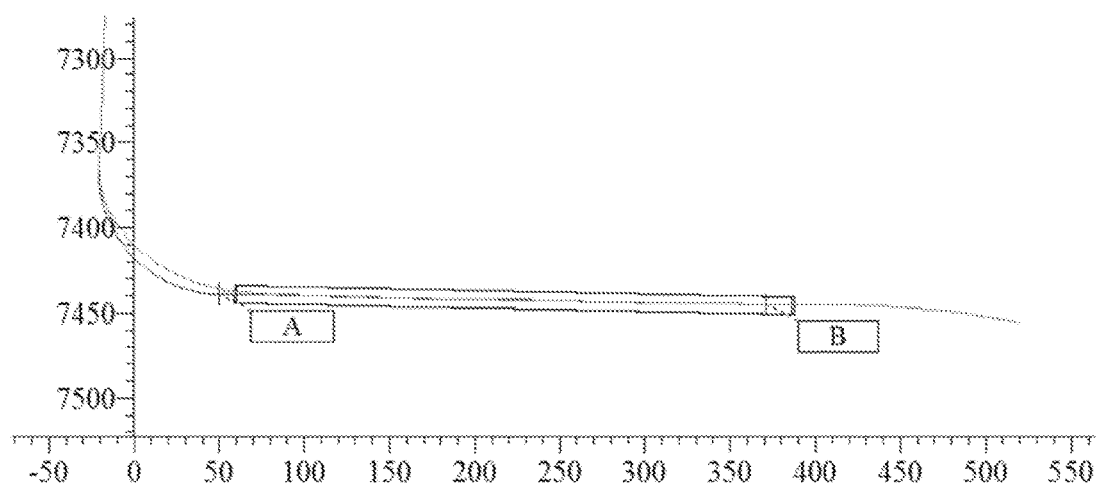
FIG. 3 shows a section of the profile of directional drilling in a field test.

A MWD instrument containing a PCBA of the current disclosure was field tested in directional drilling. FIG. 3 shows a section in the profile of the directional drilling. Table 15 shows data corresponding to the section in FIG. 3. The well has a total depth of 7947 m. The vertical section has a depth of 7456 m and the horizontal section has a total length of 521 m. The build section is between a depth of about 7372 m to about 7480 m. The horizontal section started at point A, which has a horizontal displacement of about 50 meters. Point B is the position of the drill bit. The temperature in the pay zone is about 165-170° C. The MWD instrument operated for 297 hrs downhole before it failed and was replaced.

TABLE 15

| Well Depth (m) | Vertical Depth (m) | Horizontal Displacement (m) | Azimuth (°) | Well Deflection (°) |
|---|---|---|---|---|
| 7402 | 7398 | −10 | 34.7 | 292.2 |
| 7411 | 7406 | −4 | 41.9 | 291.4 |
| 7421 | 7413 | 3 | 47.6 | 294.0 |
| 7431 | 7419 | 10 | 53.4 | 292.4 |
| 7440 | 7424 | 18 | 59.5 | 290.8 |
| 7450 | 7428 | 26 | 64.7 | 290.1 |
| 7469 | 7432 | 44 | 76.8 | 289.0 |
| 7478 | 7435 | 54 | 82.1 | 286.0 |
| 7498 | 7438 | 73 | 86.2 | 286.6 |
| 7527 | 7440 | 102 | 87.9 | 285.8 |
| 7575 | 7441 | 150 | 88.0 | 287.4 |
| 7623 | 7442 | 198 | 90.1 | 288.0 |
| 7681 | 7443 | 256 | 88.3 | 288.6 |
| 7729 | 7444 | 304 | 89.6 | 287.0 |
| 7778 | 7444 | 352 | 89.7 | 287.4 |
| 7826 | 7445 | 400 | 89.6 | 287.8 |
| 7874 | 7446 | 448 | 87.1 | 286.6 |
| 7922 | 7451 | 496 | 80.4 | 286.7 |
| 7947 | 7456 | 521 | 80.0 | 286.3 |

While in the foregoing specification this disclosure has been described in relation to certain preferred embodiments thereof, and many details have been set forth for purpose of illustration, it will be apparent to those skilled in the art that the disclosure is susceptible to alteration and that certain other details described herein can vary considerably without departing from the basic principles of the disclosure. In addition, it should be appreciated that structural features or method steps shown or described in any one embodiment herein can be used in other embodiments as well.

What is claimed is:

1. A printed circuit board assembly (PCBA) for downhole applications, comprising:
    a printed circuit board (PCB) and a plurality of electronic components installed on the PCB;
    wherein the PCB comprises a polyimide substrate, a lead-free surface finish, a plurality of traces, a plurality of surface mount pads, and a plurality of VIAs, and
    wherein a ratio between a width of one of the plurality of surface mount pads to a width of the trace connected thereto is 2 or less,
    wherein X/Y ranges from 0.8 to about 0.86, wherein X is a minimum trace width of the plurality of traces and Y is the minimum spacing between the two adjacent traces amongst the plurality of traces.

2. The printed circuit board assembly (PCBA) of claim 1, wherein the polyimide substrate is polyimide 35N or polyimide 85N.

3. The printed circuit board assembly (PCBA) of claim 2, wherein the polyimide substrate is polyimide 85N.

4. The printed circuit board assembly (PCBA) of claim 1, wherein the lead-free surface finish is electroless nickel immersion gold (ENIG), electroless gold, electroless palladium, immersion silver, immersion tin (ENEPIG), organic solder-ability preservatives (OSP), or direct gold on copper (DIG).

5. The printed circuit board assembly (PCBA) of claim 1, wherein the lead-free surface finish is electroless nickel immersion gold (ENIG).

6. The printed circuit board assembly (PCBA) of claim 1, wherein the plurality of traces have a width of 0.5 mm or higher.

7. The printed circuit board assembly (PCBA) of claim 1, wherein the plurality of VIAs comprises one or more microVIAs, one or more blind VIAs, and one or more buried VIAs.

8. The printed circuit board assembly (PCBA) of claim 1, wherein the plurality of VIAs each has a diameter of 0.30 mm or larger.

9. The printed circuit board assembly (PCBA) of claim 1, wherein the PCB further comprises one or more plated thru-holes for mounting the plurality of electronic components.

10. The printed circuit board assembly (PCBA) of claim 1, wherein the plurality of electronic components has a distance to an edge of the PCB that follows the following relation, when a height of the electronic component is less than 3 mm, the distance is at least 2.0 mm; and when a height of the electronic component is 3 mm or higher, the distance is at least 2.5 mm.

11. The printed circuit board assembly (PCBA) of claim 1, wherein the PCBA is operable at up to 200° C. for more than 500 hrs.

12. The printed circuit board assembly (PCBA) of claim 1, wherein the PCB has a copper thickness of 2 oz or less.

13. The printed circuit board assembly (PCBA) of claim 1, wherein the width of the trace is 0.5 mm or higher.

* * * * *